(12) United States Patent
Toyofuku et al.

(10) Patent No.: US 11,643,368 B2
(45) Date of Patent: May 9, 2023

(54) CERAMIC DEVICE

(71) Applicant: MARUWA CO., LTD., Owariasahi (JP)

(72) Inventors: Kazuhisa Toyofuku, Toki (JP); Masaaki Tanaka, Iwaki (JP); Kiminori Hori, Toki (JP)

(73) Assignee: MARUWA CO., LTD., Owariasahi (JP)

( * ) Notice: Subject to any disclaimer, the term of this patent is extended or adjusted under 35 U.S.C. 154(b) by 742 days.

(21) Appl. No.: 16/497,698

(22) PCT Filed: Dec. 25, 2018

(86) PCT No.: PCT/JP2018/047523
§ 371 (c)(1),
(2) Date: Sep. 25, 2019

(87) PCT Pub. No.: WO2019/131611
PCT Pub. Date: Jul. 4, 2019

(65) Prior Publication Data
US 2021/0107836 A1    Apr. 15, 2021

(30) Foreign Application Priority Data
Dec. 28, 2017  (JP) .............................. JP2017-253369

(51) Int. Cl.
*H01L 21/67* (2006.01)
*C04B 37/00* (2006.01)
(Continued)

(52) U.S. Cl.
CPC ...... *C04B 37/001* (2013.01); *H01L 21/67098* (2013.01); *H01L 21/6833* (2013.01);
(Continued)

(58) Field of Classification Search
CPC ......... H01L 21/67098; H01L 21/68785; H01L 21/67103; H01L 21/6833; H05B 3/283;
(Continued)

(56) References Cited

FOREIGN PATENT DOCUMENTS

JP    2001244320 A       9/2001
JP    2001257200 A   *   9/2001
(Continued)

OTHER PUBLICATIONS

International Search Report for PCT/JP2018/047523 (with English translation) dated Mar. 26, 2019 (5 pages).

*Primary Examiner* — Yuechuan Yu
(74) *Attorney, Agent, or Firm* — Shumaker, Loop & Kendrick, LLP

(57) ABSTRACT

The invention provides a ceramic device enabling more complex, elaborate patterns for resistance heating elements or electrodes. A ceramic device includes a ceramic substrate consisting of a ceramic sintered body and including at least a base layer, an intermediate layer laminated over the base layer, and an overlayer laminated over the intermediate layer; and an electrifiable resistance heating element or electrode having a predetermined pattern extending in a planar shape and being embedded in the ceramic substrate. A horizontal surface is defined in the upper surface of the intermediate layer, along which the resistance heating element or electrode is arranged, and the overlayer is laminated onto the upper surface of the intermediate layer to cover the resistance heating element or electrode.

11 Claims, 10 Drawing Sheets

(51) Int. Cl.
  *H01L 21/683* (2006.01)
  *H05B 3/28* (2006.01)
  *H01J 37/32* (2006.01)
(52) U.S. Cl.
  CPC .......... *H05B 3/283* (2013.01); *C04B 2237/68* (2013.01); *H01J 37/3255* (2013.01); *H01J 37/32082* (2013.01)
(58) Field of Classification Search
  CPC .................. B32B 18/00; C04B 37/001; C04B 2237/62; C04B 2237/68; C04B 2237/365; C04B 2237/343; C04B 2237/368; H01J 37/32082; H01J 37/3255
  See application file for complete search history.

(56) References Cited

FOREIGN PATENT DOCUMENTS

| | | | |
|---|---|---|---|
| JP | 2003300785 A | 10/2003 | |
| JP | 2006196311 A | 7/2006 | |
| JP | 2012096948 A | 5/2012 | |
| WO | 2017188189 A1 | 11/2017 | |

\* cited by examiner

CERAMIC DEVICE

FIELD OF THE INVENTION

The present invention relates to a ceramic device having a resistance heating element or an electrode embedded in a ceramic substrate.

BACKGROUND

As a conventional example of ceramic devices, ceramic heaters having sheet-shaped resistance heating elements in the form of heater wires embedded in plate-shaped ceramic sintered bodies are used for heating objects such as wafers in the process of producing semiconductors, for example.

Patent Document 1 shows an exemplary ceramic heater in which a heating element is embedded in a plate-shaped ceramic sintered body. Below, the numerals used in Patent Document 1 are shown in parentheses. The ceramic heater (10) includes a disc-shaped heater plate (1) and heater lines (2) in the form of a foil embedded in the heater plate (1). The method for producing the ceramic heater (10) is described below. First, a lower green body (1a) constituting the heater plate (1) is formed through compression molding. The lower green body (1a) is formed by filling a mold with a predetermined amount of ceramic powder which is the raw material for the heater plate (1) and subjecting it to compression molding. Next, the heater lines (2) with a metal coating film (4a) formed thereupon are wired into the molded lower green body (1a) at a predetermined location. After wiring the heater lines (2), another predetermined amount of ceramic powder is further loaded on the lower green body (1a) wired with the heater lines (2) and is subjected to compression molding by the mold to form an upper green body (1b), thereby forming a ceramic green body (1c). Subsequently, the ceramic green body (1c) is sintered. With ceramic as the raw material, when using aluminum nitride, heating is performed in a nitrogen atmosphere at 1600° C. to 2000° C. for several hours. After sintering, the heater plate (1) is cut to form an electrode terminal (3) for supplying electric power from an external supply.

PRIOR ART DOCUMENTS

Patent Documents

Patent Document 1: Japanese Unexamined Patent Application Publication No. 2012-96948.

SUMMARY OF THE INVENTION

Problem to be Solved by the Invention

The performance of a ceramic heater is affected by the wiring or pattern of the heater lines inside the heater, and it is preferable that a fine, elaborate heater pattern can be formed. In particular, fine heater lines have higher resistance, which can improve heating efficiency. However, in the conventional art such as in Patent Document 1, there was a problem in that during the step of loading ceramic powder on the heater lines formed in a flat shape on the lower green body and subjecting it to compression molding, the heater lines could easily become severed the finer and more elaborate the planar pattern of heater lines was. In particular, the upper surface of the compression molded lower green body was frail, making it difficult to form and maintain a planar surface. There was therefore a risk of being unable to maintain the planar pattern of the heater lines when they were clamped between the ceramic powder and the lower green body, leading to deformation or severing of the heater lines. In addition, in the ceramic heater of Patent Document 1, in the step of sintering the ceramic green body having the heater wires embedded therein, shrinkage deformation of the ceramic green body was unavoidable, and there was thus a risk of the heater lines deforming or becoming severed at the time of sintering. Therefore, in order to avoid severing of the heater lines, the conventional art employed relatively thick patterns, which made it difficult to make the pattern of the heater lines complex or elaborate.

In addition, as the pattern of the heater lines becomes more complex or elaborate, there will be an increase in the number of lines and line ends, which makes it difficult to make space for a terminal for external connection near the starting and terminal ends. In addition, even if the pattern becomes more complex, it needs to be designed with the external connection terminal in a predetermined location or concentrated in a predetermined area, depending on the device in which the heater is to be installed. However, in the ceramic heater of Patent Document 1, in order to supply power to the heater lines, the electrode terminal is formed by cutting the heater plate and mounting the terminal directly to the heater lines. It was thus another problem in the conventional art that complex or elaborate heater line patterns could not be accommodated.

Further, in the ceramic heater of Patent Document 1, the heater lines are embedded in the ceramic sintered body, and thus it was not possible to inspect whether the heater lines are suitably arranged after sintering, without using special equipment such as X-ray imaging. In particular, it was impossible to visually inspect after sintering whether the planar pattern of the heater lines was inclined, or how deep the heater lines were located. Another problem to be solved is therefore to provide a ceramic heater that allows for visual inspection after production to see whether the heater pattern is arranged along a specified plane. Moreover, in addition to ceramic heaters, this problem also applies to other ceramic devices, such as electrode devices for static chucks, RF electrode devices, etc.

It is an objective of the present invention to provide a ceramic device that solves at least one of the aforementioned problems.

Means for Solving the Problem

A ceramic device according to an embodiment of the present invention includes a ceramic substrate consisting of a ceramic sintered body and having at least a base layer, an intermediate layer laminated on an upper surface of the base layer, and an overlayer laminated on an upper surface of the intermediate layer; and a resistance heating element or an electrode embedded in the ceramic substrate having a predetermined pattern extending in a planar shape, the resistance heating element or electrode being electrifiable, wherein a horizontal surface is defined on the upper surface of the intermediate layer, the resistance heating element or electrode is arranged along the upper surface of the intermediate layer, and the overlayer is laminated on the upper surface of the intermediate layer such that the overlayer covers the resistance heating element or the electrode.

Thus, according to the ceramic device according to the present invention, the ceramic substrate is composed of a base layer, an intermediate layer, and an overlayer, and a resistance heating element or electrode having a planar pattern is arranged along an upper surface of the intermediate layer defining a horizontal surface. The overlayer covers the resistance heating element or electrode and the upper surface of the intermediate layer. In other words, since the resistance heating element or electrode is arranged along the horizontal surface of the upper surface of the intermediate layer, it is possible to prevent deformation of the planar pattern or severing of the resistance heating element or electrode. This allows for the drawing of finer, more elaborate patterns than in the conventional art.

According to a ceramic device according to a further embodiment of the present invention, in the aforementioned configuration, the intermediate layer may be provided with at least one via extending from the upper surface to a lower surface of the intermediate layer, the via being electrically connected to the resistance heating element or the electrode, and the base layer may be provided with at least one connection hole opening from a lower surface of the base layer toward the via. In other words, the resistance heating element or electrode is arranged on the upper surface of the intermediate layer, the end surface of a via penetrating in the thickness direction of the intermediate layer is arranged on the lower surface of the intermediate layer, and a connection hole penetrating the lower layer is in communication with the via. This makes it possible to leave the electric connection parts exposed to the outside without directly mounting the external connection terminal to the starting or terminal ends of the pattern. The present invention thus makes it possible to accommodate more complex and elaborate patterns.

According to a ceramic device according to a further embodiment of the present invention, the aforementioned configuration may further include conducting wires having a predetermined conducting wire pattern extending in a planar shape between the intermediate layer and the base layer, at least one connection conductor extending from the conducting wires toward the upper surface of the intermediate layer at a length less than the thickness of the intermediate layer may further be provided to the intermediate layer, and at least one connection hole opening from a lower surface of the base layer toward the connection conductor may be provided in the base layer. In other words, it will be possible to supply power from the connection holes of the base layer to the conducting wires arranged on the lower surface side of the intermediate layer through the connection conductor arranged on the lower surface side of the intermediate layer. Since the conducting wire pattern of the conducting wires can be wired independently of the pattern of the resistance heating element or electrode, the conducting wires do not interfere with the pattern of the resistance heating element or electrode. Further, since the upper surface of the connection conductor is insulated from the pattern of the resistance heating element or electrode, short-circuiting of the conducting wires and the resistance heating element or electrode inside the ceramic substrate is prevented. It is also possible to add further circuits composed of conducting wires having conducting wire patterns that correspond to purposes or applications that are either independent of or associated with the resistance heating element or electrode. As a result, it is possible to make designs that accommodate complex and elaborate patterns.

According to a ceramic device according to a further embodiment of the present invention, in the aforementioned configuration, a horizontal surface may be defined on the lower surface of the intermediate layer, and the conducting wires may be arranged along the lower surface of the intermediate layer. In other words, the conducting wires are arranged along the horizontal surface of the lower surface of the intermediate layer, and thus deformation of the planar conducting wire pattern or severing of the wires can be prevented. This allows for the drawing of finer, more elaborate patterns than in the conventional art.

According to a ceramic device according to a further embodiment of the present invention, in the aforementioned configuration, the connection conductor may have a rounded upper end. The rounded corners of the connection conductor's upper end reduce the risk of cracking due to thermal stress when using the heater.

According to a ceramic device according to a further embodiment of the present invention, in the aforementioned configuration, the base layer, the intermediate layer, and the overlayer may adhere closely to one another without any gaps between adjacent layers. Due to the close adherence without gaps, no insulation flaws will occur, which suppresses thermal conduction loss.

According to a ceramic device according to a further embodiment of the present invention, in the aforementioned configuration, the intermediate layer may have a different brightness than the base layer and the overlayer. In this way, since the resistance heating element or electrode is arranged on the upper surface of the intermediate layer, by looking at the layer boundaries from the side it is possible to easily determine the depth of the pattern and whether or not it is inclined.

According to a ceramic device according to a further embodiment of the present invention, in the aforementioned configuration, the resistance heating element or electrode may consist of a patterned conductive foil. In addition, the conducting wires may also consist of a patterned conductive foil. Further, the electrode may be an electrode for an electrostatic chuck or an RF electrode.

According to another embodiment of the present invention, the ceramic device includes a ceramic substrate consisting of a ceramic sintered body and having at least a base layer, an intermediate layer laminated on an upper surface of the base layer, and an overlayer laminated on an upper surface of the intermediate layer; a resistance heating element or an electrode embedded in the ceramic substrate having a predetermined pattern extending between the intermediate layer and the overlayer, the resistance heating element or electrode being electrifiable; and conducting wires having a predetermined conducting wire pattern extending in a planar shape between the intermediate layer and the base layer, the conducting wires being embedded in the ceramic substrate in a different layer than the resistance heating element or electrode, wherein the intermediate layer is provided with at least one connection conductor extending from the conducting wires toward the upper surface of the intermediate layer at a length less than the thickness of the intermediate layer, and the base layer is provided with at least one connection hole opening from a lower surface of the base layer toward the connection conductor.

In other words, according to the ceramic device according to the present invention, it will be possible to supply power from the connection holes of the base layer to the conducting wires arranged on the lower surface side of the intermediate layer through the connection conductor arranged on the lower surface side of the intermediate layer. Since the conducting wire pattern of the conducting wires can be wired independently of the pattern of the resistance heating element or electrode, the conducting wires do not interfere with the pattern of the resistance heating element or electrode. Further, since the upper surface of the connection conductor is insulated from the pattern of the resistance heating element or electrode, short-circuiting of the conducting wires and the resistance heating element or electrode inside the ceramic substrate is prevented. It is also possible to add further circuits composed of conducting wires having conducting wire patterns that correspond to purposes or applications that are either independent of or associated with the resistance heating element or electrode. As a result, it is possible to make designs that accommodate complex and elaborate patterns.

According to a ceramic device according to a further embodiment of the present invention, in the aforementioned configuration, the intermediate layer may be provided with at least one via that is electrically connected to the resistance heating element or electrode and the conducting wires and which extends from the upper surface to the lower surface of the intermediate layer, and the conducting wires may be connected to the via and to the connection conductor. In other words, it will be possible to supply power from the connection holes of the base layer to the resistance heating element or electrode arranged on the upper surface side of the intermediate layer through the conducting wires and the connection conductor arranged on the lower surface side of the intermediate layer, the power passing through the via. In particular, since the conducting wire pattern of the conducting wires can be wired independently of the pattern, the position of the connection conductor and the connection holes can be set to any horizontal position. Thus, by going through the conducting wires and the connection conductor, it is possible to design the ceramic device such that the power supply unit is in a predetermined position or concentrated in a predetermined area, regardless of the positions of the starting and terminal ends of the resistance heating element or electrode. The present invention thus provides greater freedom of design.

Effects of the Invention

The ceramic device according to the present invention enables more complex and elaborate patterns of the resistance heating element or electrode.

DETAILED DESCRIPTION

The ceramic device according to the present embodiment is a ceramic heater that is generally shaped like a disc having a predetermined thickness, and is installed in devices for producing semiconductors where it is used to heat waters and the like in the production process. However, the ceramic heater described here is merely one predetermined example of the present invention, and it goes without saying that the ceramic heater according to the present invention may be used for many different kinds of applications.

Figure 1:
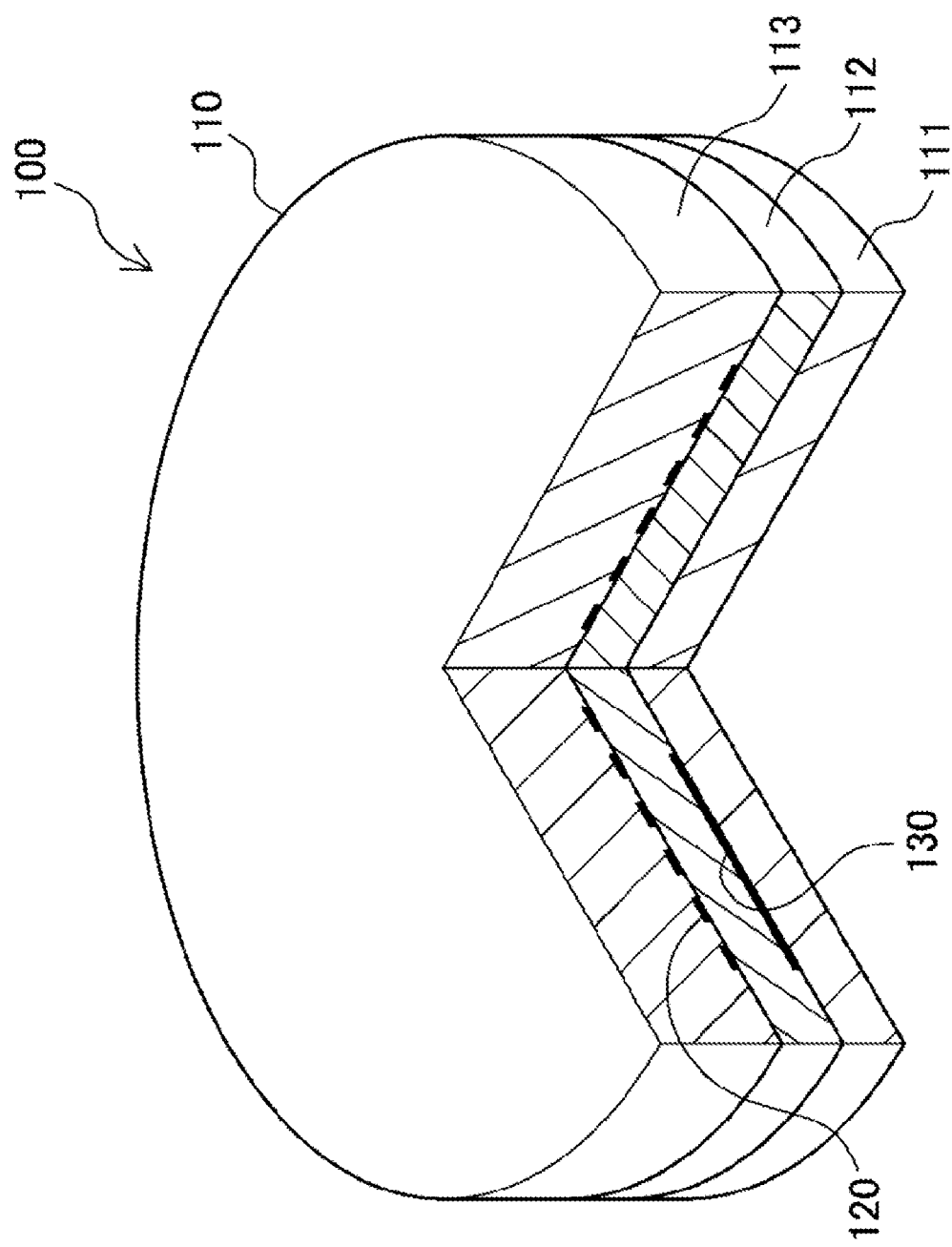
FIG. 1 is a partial cross-sectional perspective view of a ceramic device according to an embodiment of the present invention in the form of a ceramic heater.
Figure 2:
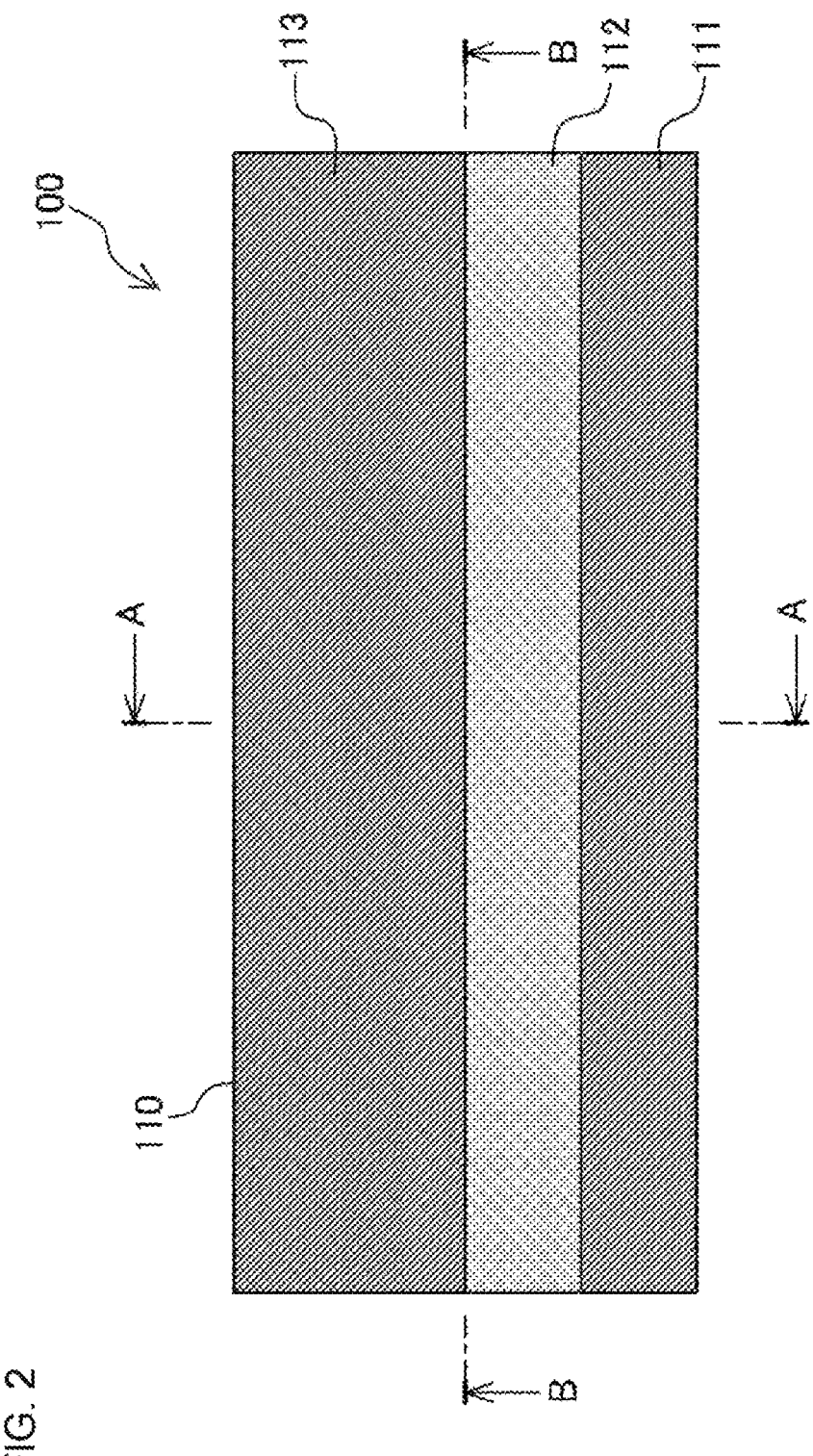
FIG. 2 is a side view of the ceramic heater shown in FIG. 1.
Figure 3:
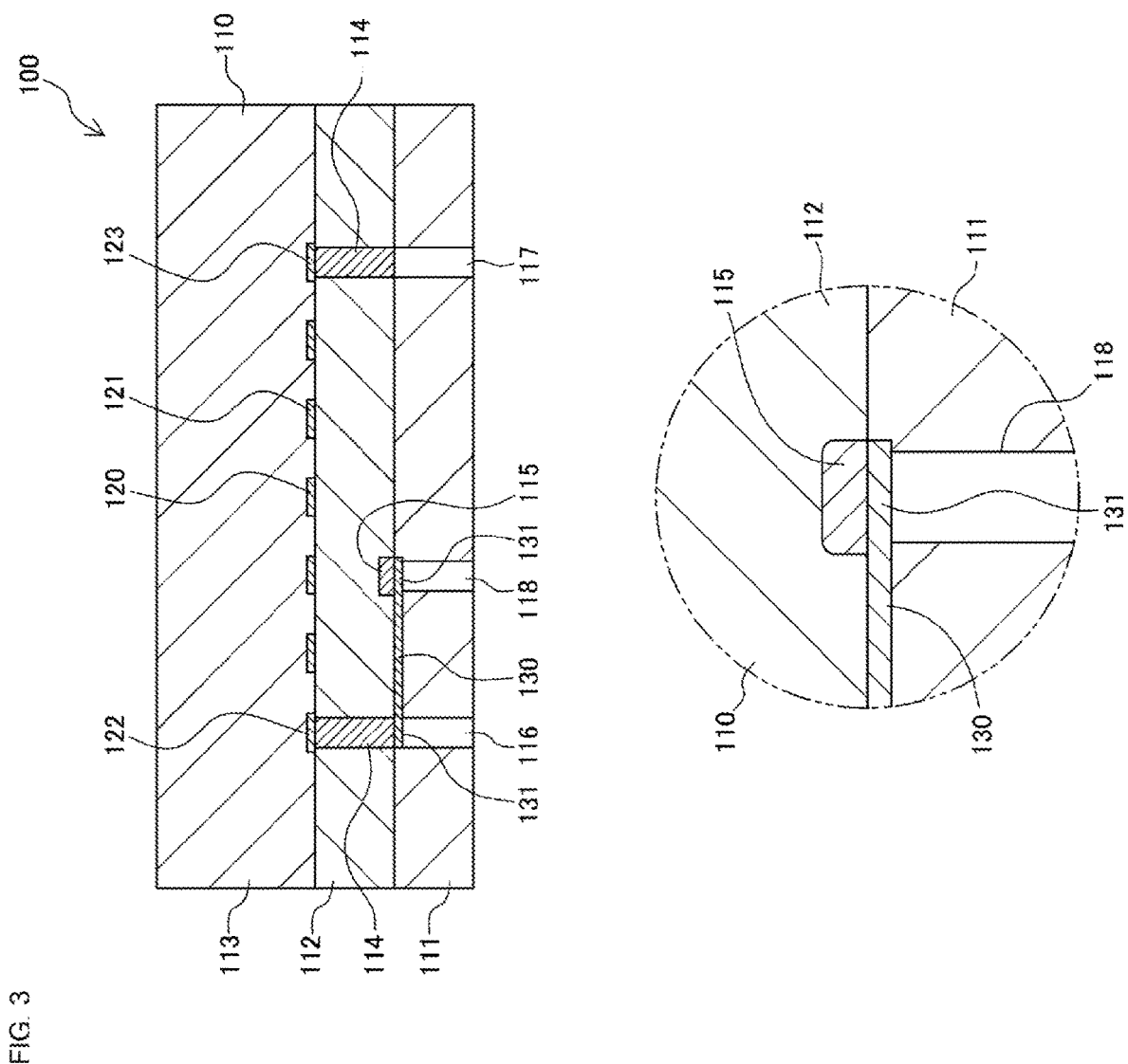
FIG. 3 is a cross-sectional view taken along line A-A in FIG. 2
Figure 4:
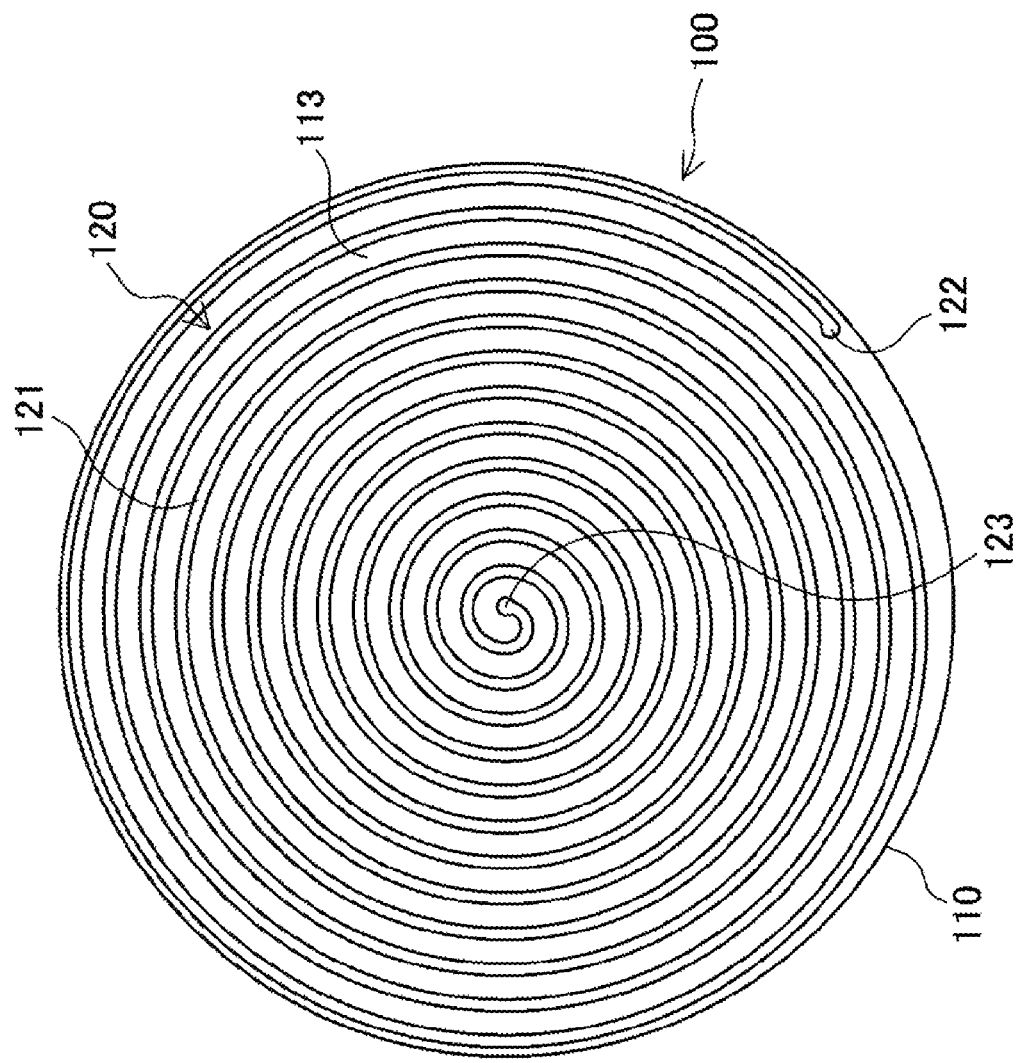
FIG. 4 is a cross-sectional view taken along line B-B in FIG. 2

FIG. 1 is a partial cross-sectional perspective view showing a ceramic heater 100. FIG. 2 is a side view of the ceramic heater 100. FIGS. 3 and 4 are cross-sectional views of the ceramic heater, respectively taken along the lines A-A and B-B. For simplicity of description, FIGS. 1 to 4 represent the structure of the ceramic heater 100 schematically, with no regard for precise consistency throughout the drawings.

As shown in FIG. 1, the ceramic heater 100 includes a disc-shaped ceramic substrate 110 consisting of a ceramic sintered body, heater wires 120 that are embedded in the ceramic substrate 110 and emit heat when electrified, and conducting wires 130 that are embedded in the ceramic substrate 110 in a different layer in the thickness direction than the heater wires 120. The ceramic heater 100 is formed to have parallel, smooth, horizontal upper and lower surfaces.

The ceramic substrate 110 consists of a ceramic sintered body. In the present embodiment, the ceramic substrate 110 is a sintered body of aluminum nitride (AlN) raw material powder. The ceramic material constituting the ceramic substrate may also be silicon nitride (SiN), aluminum oxide ($Al_2O_3$), or silicon carbide (SiC).

As shown in FIG. 2, the ceramic substrate 110 has a three-layered construction consisting of a base layer 111 of a predetermined thickness at the bottom, an intermediate layer 112 laminated on an upper surface of the base layer 111, and an overlayer 113 laminated on an upper surface of the intermediate layer 112. The layers are laminated without gaps. The boundaries between the layers run parallel with the upper and lower surfaces of the ceramic heater 100. Flat, smooth, horizontal surfaces (that extend in parallel with the upper and lower surfaces of the ceramic heater 100) are defined on the upper and lower surfaces of the intermediate layer 112. In other words, the upper and lower surfaces of the intermediate layer 112 are flat surfaces with essentially no uneven portions. However, the upper surface of the base layer 111 has recesses formed therein for housing the conducting wires 130, and the lower surface of the overlayer 113 has recesses formed therein for housing the heater wires 120. Thus, the conducting wires 130 are embedded in the ceramic substrate 110 such that the base layer 111 is in close contact with the side and lower surfaces of the conducting wires 130, and the heater wires 120 are embedded in the ceramic substrate 110 such that the overlayer 113 is in close contact with the side and upper surfaces of the heater wires 120.

Further, as schematically shown in FIG. 2, the layers of the ceramic substrate 110 differ in brightness. Specifically, the intermediate layer 112 is a lighter brightness of gray compared to the base layer 111 and the overlayer 113. Thus, although the base layer 111, intermediate layer 112, and overlayer 113 are integrated into one piece, their boundaries can be determined by looking at their brightness. In other words, it is possible to visually inspect whether the base layer 111, intermediate layer 112, and overlayer 113 are suitably arranged in parallel. As described later, the difference in brightness of the layers is achieved by intentionally introducing a difference in sintering time of the intermediate layer 112 compared to the base layer 111 and overlayer 113 during the production process. In the present embodiment, the base layer 111 and intermediate layer 112 are approximately equal in thickness, while the overlayer 113 is twice as thick as the base layer 111 and intermediate layer 112. As such, the boundary between the intermediate layer 112 and the overlayer 113 in which the heater wires 120 are arranged is positioned approximately in the center in the thickness direction of the ceramic heater 100. This allows the entire ceramic heater 100 to emit heat uniformly.

Further, as shown in FIG. 3, the intermediate layer 112 is provided with a plurality of vias 114 (two in the present embodiment) that extend from the upper surface to the lower surface of the intermediate layer 112. The vias 114 are embedded in the intermediate layer 112 without gaps. In addition, the upper and lower end surfaces of the vias 114 are flush respectively with the upper surface and lower surface of the intermediate layer 112. In other words, the vias 114 are not inserted into the base layer 111 or overlayer 113. The vias 114 consist of conductors that electrically connect the upper surface and lower surface of the intermediate layer 112. Generally, the conductor is preferably made of one or more conductive metals with a high melting point selected from molybdenum, tungsten, niobium or tantalum, or an alloy containing one or more of these metals. In the present embodiment, the vias 114 consist of molybdenum pins that penetrate the intermediate layer 112 in the thickness direction. However, the vias may also take the form of metal-plated via holes.

The intermediate layer 112 is also provided with at least one (one in the present embodiment) connection conductor 115 that extends from the lower surface to the upper surface of the intermediate layer 112 at a length that is shorter than the thickness of the intermediate layer 112. The connection conductor 115 is embedded in the intermediate layer 112 without gaps. The lower end of the connection conductor 115 is flush with the lower surface of the intermediate layer 112. On the other hand, the upper end of the connection conductor has a rounded shape, as shown in the partial magnified view of FIG. 3. Due to the rounded shape of the upper end of the connection conductor, even when thermal stress occurs when the heater is being used, the risk of cracking in the intermediate layer 112 is reduced.

Further, the base layer 111 is provided with at least one connection hole 116, 117 that penetrate the base layer 111 in the thickness direction and open from the lower surface of the base layer 111 toward the vias 114, and at least one connection hole 118 that opens from the lower surface of the base layer 111 toward the connection conductor 115. The connection holes 116, 117 for the vias communicate with the vias 114 from the lower surface side of the base layer 111, and provide connection ports for an external terminal for supplying power. The connection hole 118 for the connection conductor 115 communicates with the connection conductor 115 from the lower surface side of the base layer 111, and also provides a connection port for an external terminal.

The heater wires 120 constitute a planar resistance heating element having a predetermined pattern that extends in a planar shape. The resistance heating element may generally be made of one or more conductive metals with a high melting point selected from molybdenum, tungsten, niobium or tantalum, or an alloy containing one or more of these metals. In the present embodiment, molybdenum is selected, and the heater wires 120 consist of a patterned conductive foil. In general, the smaller the cross-sectional area of the heater wires 120, the higher the resistance value, which leads to a higher heating value. As shown in FIG. 4, the heater wires 120 include a heater pattern 121 of narrow, thin conductive wires in a complex and elaborate arrangement, a starting end 122 of the heater pattern 121, and a terminal end 123 of the heater pattern 121. It should be noted that the heater pattern shown in FIG. 4 is merely an example, and that a person skilled in the art could freely select the shape of the heater pattern. In other words, the exemplary heater pattern of FIG. 4 is not illustrated consistently with FIGS. 1 to 3 in terms of its positional relationship. It goes without saying that the pattern may be designed such that the starting end and terminal end are arranged at both ends in the radial direction, or such that the starting end and terminal end are arranged near the center.

The heater wires 120 are placed on the horizontal upper surface of the intermediate layer 112, and their planar shape is maintained along the upper surface of the intermediate layer 112. At this time, the upper surface of the intermediate layer 112 and the lower surface of the heater wires 120 are in close contact without any gaps. In addition, the heater wires 120 are covered by the overlayer 113 that is laminated onto the upper surface of the intermediate layer 112. At this time, the overlayer 113, the heater wires 120, and the intermediate layer 112 are in close contact without any gaps. The heater pattern 121 of the heater wires 120 thus extend along the upper surface of the intermediate layer 112 while their planar shape is maintained. In other words, by making the upper surface of the intermediate layer 112 planar in shape, the planar shape of the heater wires 120 can be securely maintained, without the heater wires 120 bending in the thickness direction.

The conducting wires 130 consist of a conductor having a predetermined conducting wire pattern (not shown) that extends in a planar shape. The conducting wires 130 have a connection part 131 that is in electrical contact with a connection target. Generally, the conductor can be made of one or more conductive metals with a high melting point selected from molybdenum, tungsten, niobium or tantalum, or an alloy containing one or more of these metals. In the present embodiment, molybdenum is selected. Further, in the present invention, the conducting wires 130 are used as a pathway for supplying power from the intermediate layer 112 on the lower layer side to the heater wires 120 on the upper layer side. The conducting wires 130 consist of a patterned conductive foil. The conducting wires 130 themselves need not serve the purpose of generating heat, but may be designed to have a relatively large cross-sectional area so as not to generate more heat than the heater wires 120. Alternatively, the conductor pattern of the conducting wires 130 may include part or all of a heat emitter such as a circuit portion or heater wire having a specific functionality.

The conducting wires 130 are arranged on the horizontal lower surface of the intermediate layer 112, and their planar shape is maintained along the lower surface of the intermediate layer 112. At this time, the lower surface of the intermediate layer 112 and the upper surface of the conducting wires 130 are in close contact without any gaps. In addition, the conducting wires 130 are embedded in the base layer 111 formed beneath the lower surface of the intermediate layer 112. At this time, the base layer 111, the conducting wires 130, and the intermediate layer 112 are in close contact without any gaps. The conducting wire pattern of the conducting wires 130 thus extend along the lower surface of the intermediate layer 112 while their planar shape is maintained. In other words, by making the lower surface of the intermediate layer 112 planar in shape, the planar shape of the conducting wires 130 can be securely maintained, without the conducting wires 130 bending in the thickness direction.

In the ceramic heater 100 according to the present embodiment, the lower surface of the starting end 122 of the heater wires 120 is in contact with the upper end surface of one via 114, while the upper surface of the connection part 131 at one end (shown on the left side in FIG. 3) of the conducting wires 130 is in contact with the lower end surface of the via 114, whereby the via 114 electrically connects the heater wires 120 and conducting wires 130. In addition, the upper surface of a connection part 131 at the other end (shown on the right side in FIG. 3) of the conducting wires 130 is in contact with the lower end of the connection conductor 115. In other words, the via 114 and the connection conductor 115 are electrically connected by the conducting wires 130. Moreover, since the upper end of the connection conductor 115 is not exposed at the upper surface of the intermediate layer 112, there is no risk of short-circuiting of the heater wires 120 and the conducting wires 130. By selecting one of the connection holes 116, 118 and inserting an external terminal (one electrode terminal) connected to an external power supply into the connection hole, the external power supply can be electrically connected to the starting end 122 of the heater wires 120. Further, the lower surface of the terminal end 123 of the heater wires 120 is in contact with the upper end surface of the other via 114, which faces the lower surface side of the intermediate layer 112 through the connection hole 117. By inserting an external terminal (another electrode terminal) into the connection hole 117, an external power supply can be connected to the terminal end 123 of the heater wires 120. In other words, the ceramic heater 100 can be supplied with power from an external power supply through the connection holes 116 to 118 open at the lower surface of the base layer 111.

Next, the method for producing the ceramic heater according to the present embodiment is described. The method for producing the ceramic heater 100 according to the present embodiment includes the steps of: forming a ceramic sintered body corresponding to the intermediate layer 112 including the vias 114 and the connection conductor 115; polishing the upper and lower surfaces of the ceramic sintered body to obtain a precursor sintered body of the intermediate layer 112 having smooth horizontal surfaces; forming the heater wires 120 and conducting wires 130 on the upper and lower polished surfaces of the precursor sintered body; forming the overlayer and the base layer on the respective upper and lower surfaces of the precursor sintered body; and forming the connection holes in the base layer 111. Each step is described in further detail below.

First, ceramic raw material powder (AlN powder in the present embodiment) is loaded into a die corresponding to the diameter of the ceramic heater 100, and pins with high melting points are arranged standing vertically at predetermined positions in the die. The pins may be molded bodies made using metal powder with a high melting point. The pins are arranged in the locations where the vias 114 and connection conductor 115 are to be provided, and their diameters may be freely selected. The ceramic raw material powder is then sintered in a compressed state for a predetermined length of time (several hours) in a nitrogen atmosphere. As an example, the temperature at which the ceramic raw material powder can be sintered was set to about 1750 to 2000° C., and the pressure conditions were set to about 150 to 250 kgf/cm$^2$. In this way, a ceramic sintered body 112' corresponding to the intermediate layer 112 was obtained (See FIG. 5 (a)). By introducing hot pressing, the pins are prevented from moving during the sintering, and can thus be arranged precisely at their respective predetermined positions. In particular, sintering is carried out while pressing from above and below, meaning that the sintered body will compress only vertically and barely compress horizontally at all. This improves precision of the positions of the terminals and vias.

Further, in the aforementioned process, by arranging the pins prior to sintering, it becomes possible to, for example, form vias and conductors with diameters in excess of 1 mm, compared to post-firing techniques where holes are opened in the sintered substrate. The advantages of using large-diameter vias include; (1) large currents are possible, (2) the contact area of the via or connection conductor with the heater wires or conducting wires becomes bigger, making the conduction more reliable, and (3) there is a lower risk of displacement that would cause connection issues of the vias or connection conductor with the heater pattern or conductor pattern or poor conductivity when forming the connection holes.

Figure 5:
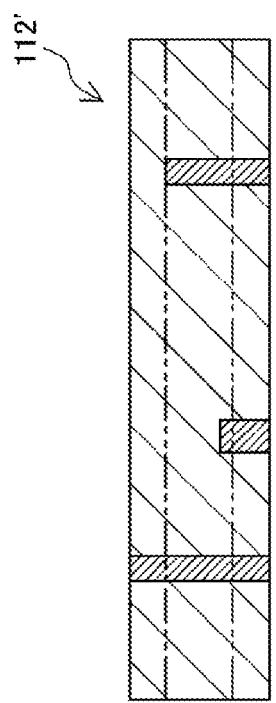
FIG. 5 shows a step in the process of producing the ceramic heater according to an embodiment of the present invention, where (a) is a schematic view showing a step of adhering heater wires and conducting wires to the intermediate layer.
Figure 5:
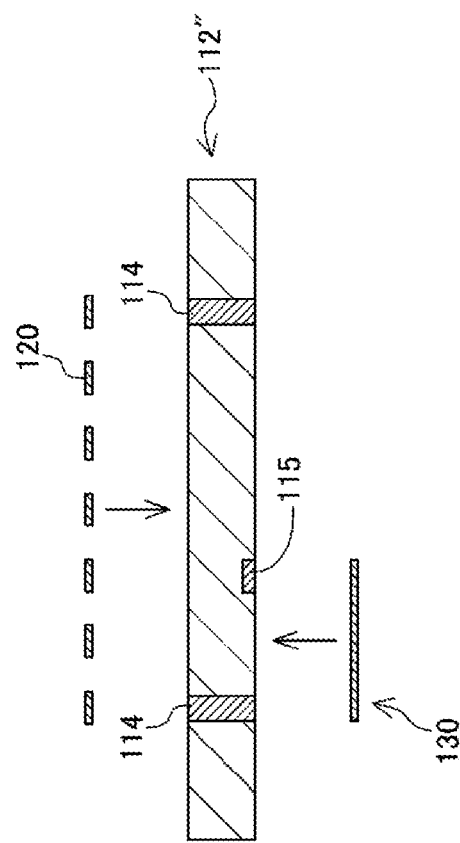

Next, the ceramic sintered body 112' was removed from the die, and adjusted to a predetermined thickness by polishing the upper and lower surfaces of the ceramic sintered body 112' along the dashed lines shown in FIG. 5 (a) until the upper and lower end surfaces of the pins corresponding to the vias 114 are exposed and the lower end surface of the pin corresponding to the connection conductor 115 is exposed. In this way, a precursor sintered body 12" of the intermediate layer 112 with smooth horizontal upper and lower surfaces (polished surfaces) was obtained. Then, as shown in FIG. 5 (b), a conducting foil constituting the heater wires 120 and conducting wires 130 were placed (arranged) in a sheet pattern form on the respective polished surfaces (upper and lower surfaces) of the precursor sintered body 112". The heater wires and conducting wires may also be formed by other means, such as vapor deposition or etching, screen printing, and so forth.

Figure 6:
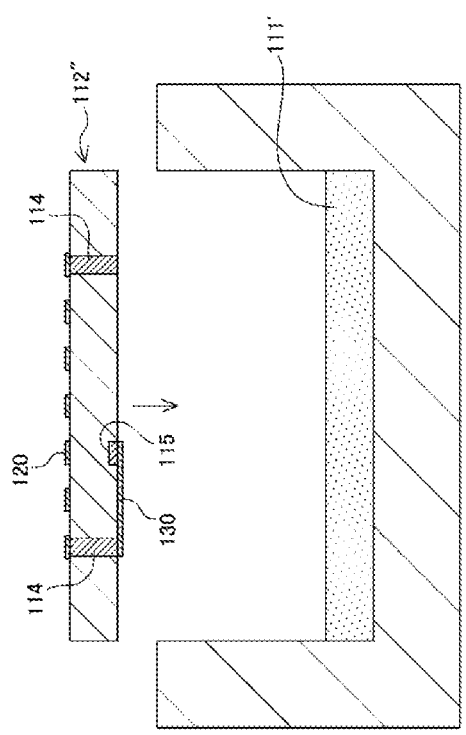
FIG. 6 is a schematic view showing a step in the process of producing the ceramic heater according to an embodiment of the present invention, where the overlayer and the base layer are formed respectively at the upper surface side and the lower surface side of the intermediate layer.
Figure 6:
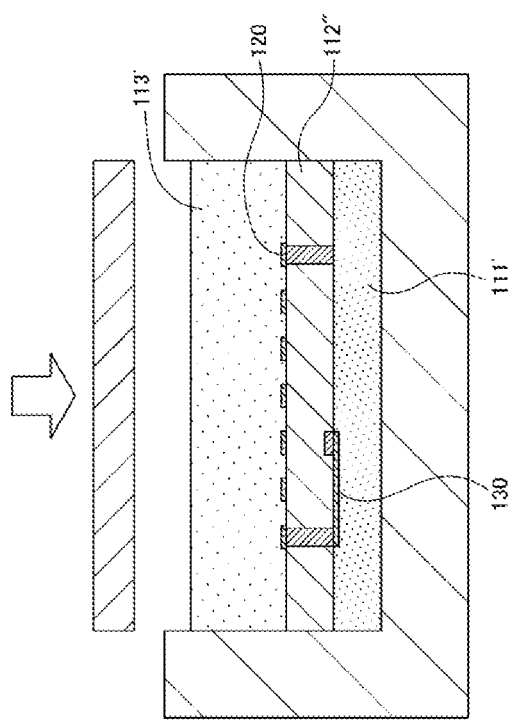

Next, an amount of ceramic raw material powder corresponding to the base layer 111 is loaded in the die to form a precursor 111' of the base layer 111. As shown in FIG. 6 (a), the precursor sintered body 112" of the intermediate layer 112 having the heater wires 120 and conducting wires 130 adhered thereto is placed on top of the press-molded ceramic raw material powder. Further, an amount of ceramic raw material powder corresponding to the overlayer 113 is placed on top of the precursor sintered body 112" and press molded to form a precursor 113' of the overlayer 113. By having the precursor sintered body 112" be pressed from both sides by the ceramic raw material powder, the heater wires 120 and conducting wires 130 arranged along the hard horizontal surfaces of the precursor sintered body 112" become embedded in the ceramic raw material powder.

Then, as shown in FIG. 6 (b), a carbon plate is placed on top of the ceramic raw material powder, and the ceramic raw material powder is sintered in a compressed state in a nitrogen atmosphere for a predetermined length of time (several hours). As an example, the temperature at which the ceramic raw material powder can be sintered was set to about 1750 to 2000° C., and the pressure conditions were set to about 150 to 250 kgf/cm². Because the precursor sintered body 112" is of a sufficient hardness compared to the molded bodies of ceramic raw material powder, the heater wires 120 and conducting wires 130 are maintained in a planar shape along the horizontal surfaces without deforming during compression. As a result, a ceramic substrate 110 having a three-layered construction consisting of the base layer 111, the intermediate layer 112, and the overlayer 113 is obtained without causing severing or deformation of the heater wires 120 and conducting wires 130. Further, by the introduction of hot pressing, it is possible to prevent the relative positions of the vias 114 and connection conductor 115 and the heating wires 120 and conducting wires 130 from shifting during sintering. In particular, sintering is carried out while pressing from above and below, meaning that the sintered body will compress only vertically and barely compress horizontally at all, which increases positional precision in the surfaces of each component. This increased precision reduces the risk of connection issues between the vias 114, the connection conductor 115, and the heater wires 120 and conducting wires 130, and reduces the risk of poor conductivity when forming the connection holes 116 to 118.

The surface and side surface of the ceramic substrate 110 are then polished. Since the intermediate layer 112 undergoes two sintering steps as it is formed, the intermediate layer 112 will be of a brighter shade than the base layer 111 and the overlayer 113. It is thus possible to inspect whether or not the heater wires 120 and/or the conducting wires 130 are displaced from the horizontal direction by looking at the boundaries between the intermediate layer 112 and the base layer 111 and the overlayer 113. If the intermediate layer 112 is inclined, the distance between the outer surface of the ceramic heater 100 and the heater wires 120 will vary, which may make it impossible to obtain the desired heater performance. In the event that the intermediate layer 112 is inclined, it is possible to make adjustments by polishing the outer surface of the ceramic substrate 110 with reference to the aforementioned boundaries in order to make the upper surface of the ceramic substrate 110 parallel with the heater pattern of the heater wires 120.

Next, the connection holes 116 to 118 are formed in the lower surface of the base layer 111 so as to communicate with the vias 114 and connection conductor 115 (or the joints with the conductor wires 130). It will then be possible, making adaptations for a power supply of the device in which to mount the ceramic device, to connect a metallic terminal for the power supply to the ceramic heater 100 through the connection holes 116 to 118.

It should be noted that the production process described above is merely one example of the invention, and that various substitutions, omissions, and/or additions are possible within the scope of the present invention.

The operational effects of the ceramic heater 100 according to an embodiment of the present invention are described below.

According to the ceramic heater 100 of the present embodiment, the ceramic substrate 110 is composed of the base layer 111, the intermediate layer 112, and the overlayer 113, and the heater wires 120 having a planar heater pattern are arranged along the upper surface of the intermediate layer 112, which defines a horizontal surface. The overlayer 113 covers the heater wires 120 and the intermediate layer 112. In other words, because the heater wires 120 are arranged along the horizontal polished upper surface of the intermediate layer 112, deformation of the planar heater pattern or severing of the heater wires 120 can be prevented. This allows for the drawing of finer, more elaborate patterns than in the conventional art. Moreover, since the intermediate layer 112 differs in brightness from the base layer 111 and overlayer 113, it is possible to easily determine the depth of the heater wires 120 and whether or not they are inclined by looking at the layer boundaries from the side, without using a special device for this purpose. Further, in the ceramic heater 100 according to the present embodiment, it is possible to supply power from the connection holes 116 to 118 of the base layer 111 to the heater wires 120 arranged on the upper surface side of the intermediate 112 layer through the conducting wires 130 and the connection conductor 115 arranged on the lower surface side of the intermediate layer 112, the power passing through the via 114. In particular, since the conducting wire pattern of the conducting wires 130 can be wired independently of the heater pattern, the position of the connection conductor 115 and the connection hole 118 can be set to any horizontal position. Thus, by going through the conducting wires 130 and the connection conductor 115, it is possible to design the ceramic device such that the power supply unit is in a predetermined position or concentrated in a predetermined area, regardless of the positions of the starting and terminal ends of the heater wires 120. As a result, the ceramic heater 100 according to the present embodiment can accommodate more complex and elaborate heater patterns.

Separate Embodiments/Variants

The present invention is not limited to the embodiment described above, but may take on a variety of embodiments and variants. A number of such variants of the present invention are described below. In each embodiment, unless otherwise stated, elements denoted by numerals having the last two digits in common have the same or similar features, and part of the description thereof is omitted.

Figure 7:
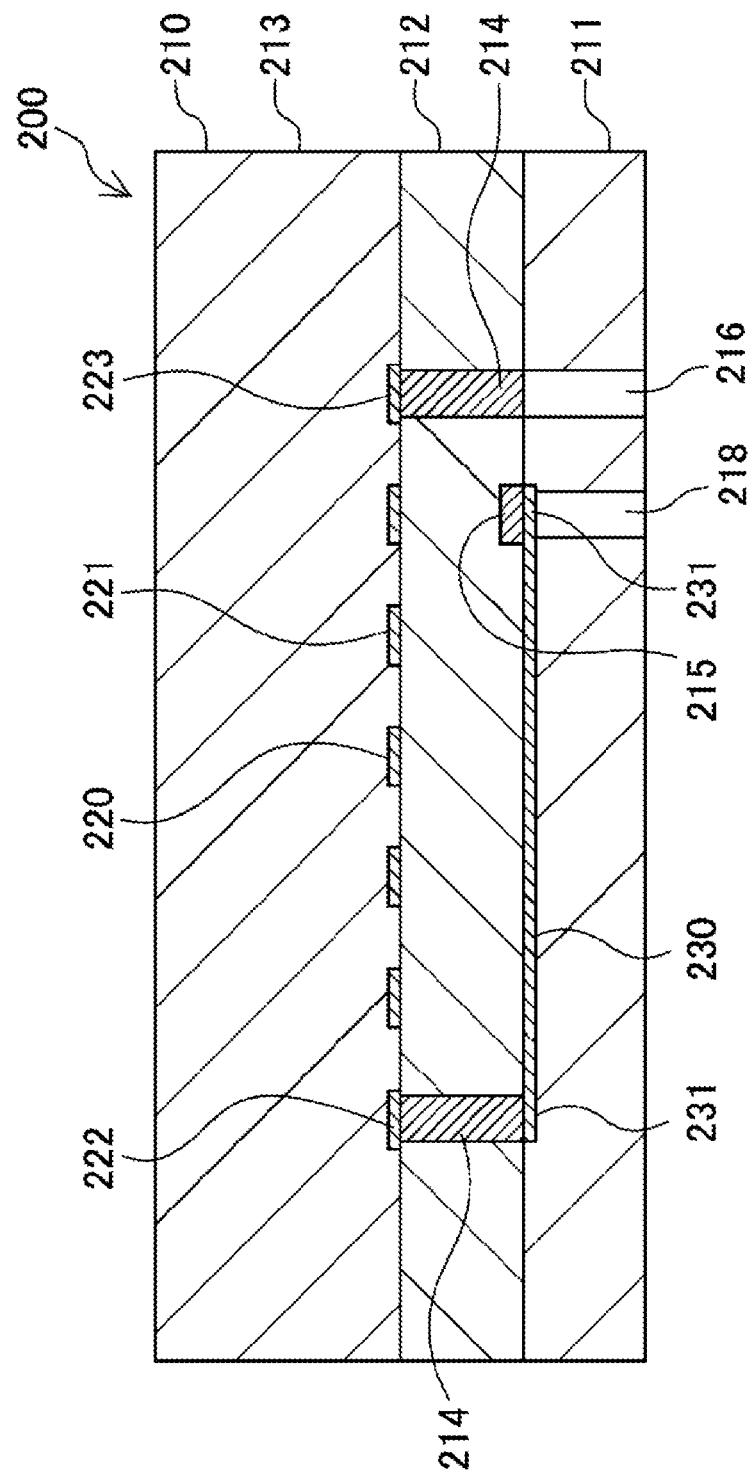
FIG. 7 is a schematic cross-sectional view of a ceramic heater according to another embodiment of the present invention.

(1) The ceramic device according to the present invention is not limited to the embodiment described above. In the ceramic device 200 shown in FIG. 7, two vias 214, 214 extending from the upper surface to the lower surface of the intermediate layer 212 are provided, as well as one connection conductor 215 extending from the lower surface toward the upper surface of the intermediate layer 212 at a length less than the thickness of the intermediate layer 212. Underneath one of the vias 214 (on the left side in FIG. 7) no connection hole is formed, while a connection hole 216 is formed underneath the other one of the vias 214 (on the right side in FIG. 7). The connection conductor 215 is arranged in close proximity to this other via 214. In addition, a connection hole 218 is formed underneath the connection conductor 215. The conducting wires 230 connect the via 214 and the connection conductor 215. In other words, in the ceramic device 200 according to the present variant, the power supply ports (or terminals) are concentrated.

Figure 8:
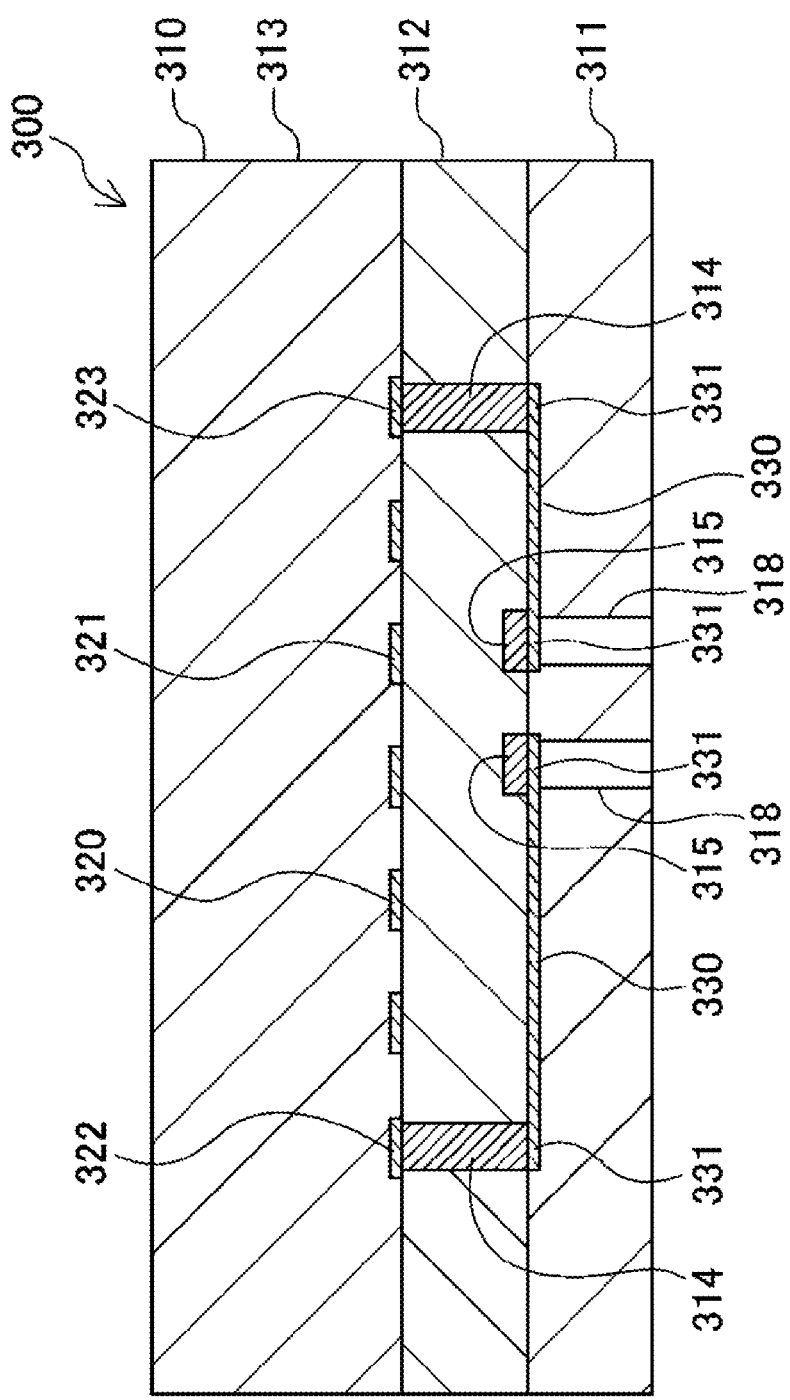
FIG. 8 is a schematic cross-sectional view of a ceramic heater according to another embodiment of the present invention.

(2) The ceramic device according to the present invention is not limited to the embodiments described above. In the ceramic device 300 shown in FIG. 8, two vias 314, 314 extending from the upper surface to the lower surface of the intermediate layer 312 are provided, as well as two connection conductors 315, 315 extending from the lower surface toward the upper surface of the intermediate layer 312 at a length less than the thickness of the intermediate layer 312. The connection conductors 315, 315 are arranged at a distance from the vias 314, 314, but are concentrated closely with each other. No connection holes are formed underneath both of the vias 314, 314, while connection holes 318, 318 are formed only underneath the connection conductors 315, 315. Two conducting wires 330, 330 connect the adjacent vias 314, 314 and connection conductors 315, 315. In other words, in the ceramic device 300 according to the present variant, the power supply ports (or terminals) are concentrated in a position that is independent of the position of the pattern of the resistance heating element or electrode (or the vias).

Figure 9:
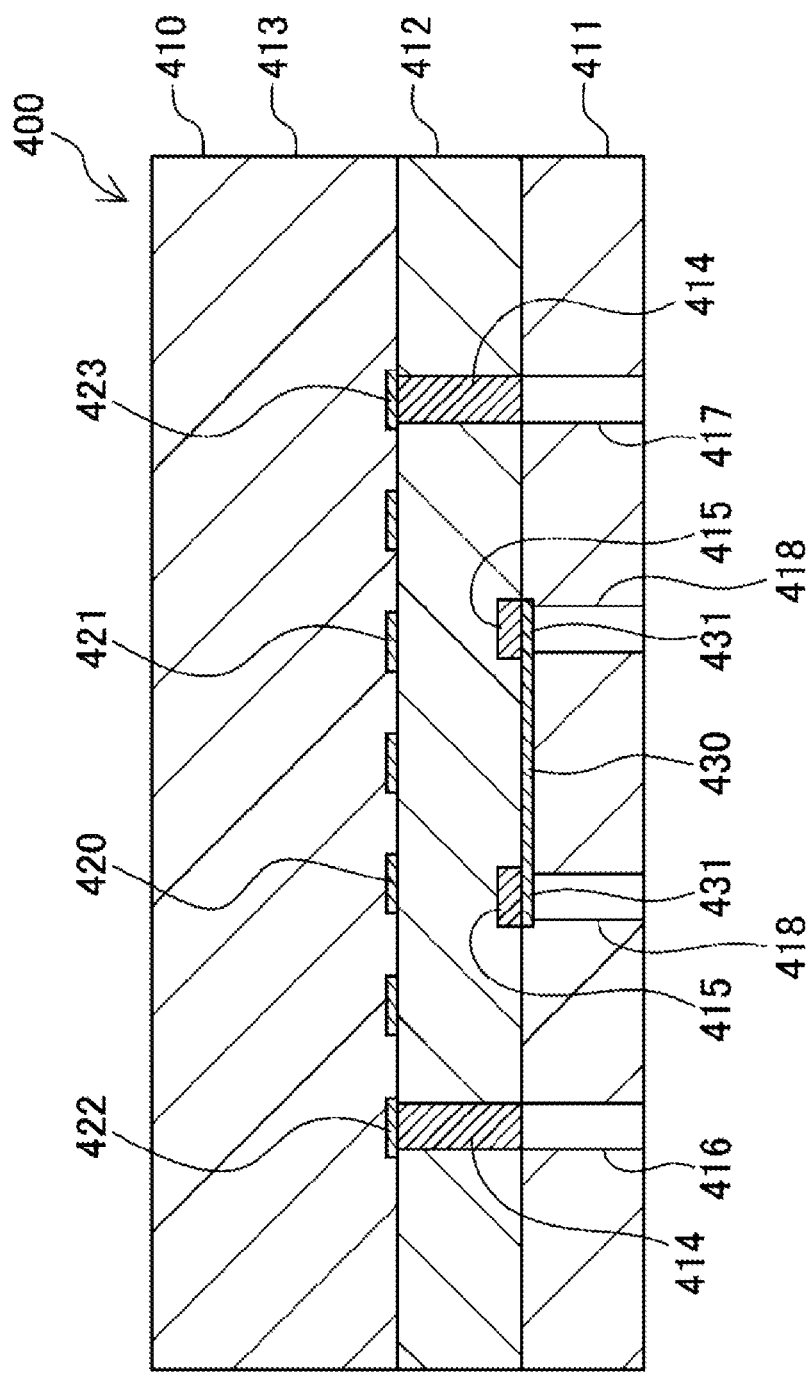
FIG. 9 is a schematic cross-sectional view of a ceramic heater according to another embodiment of the present invention.

(3) The ceramic device according to the present invention is not limited to the embodiments described above. In the ceramic device 400 shown in FIG. 9, two vias 414, 414 extending from the upper surface to the lower surface of the intermediate layer 412 are provided, as well as two connection conductors 415, 415 extending from the lower surface toward the upper surface of the intermediate layer 412 at a length less than the thickness of the intermediate layer 412. Connection holes 416, 417 are formed underneath both of the vias 414, 414, and connection holes 418, 418 are formed underneath both of the connection conductors 415, 415. The conducting wires 430 connect the connection conductors 415, 415 to each other, but are not electrically connected to the vias 414, 414. In other words, the ceramic device 400 according to the present variant allows for the separate arrangement or addition of a circuit of conducting wires 430 with a conducting wire pattern having a functionality or application that is independent of the pattern of the resistance heating element or electrode.

Figure 10:
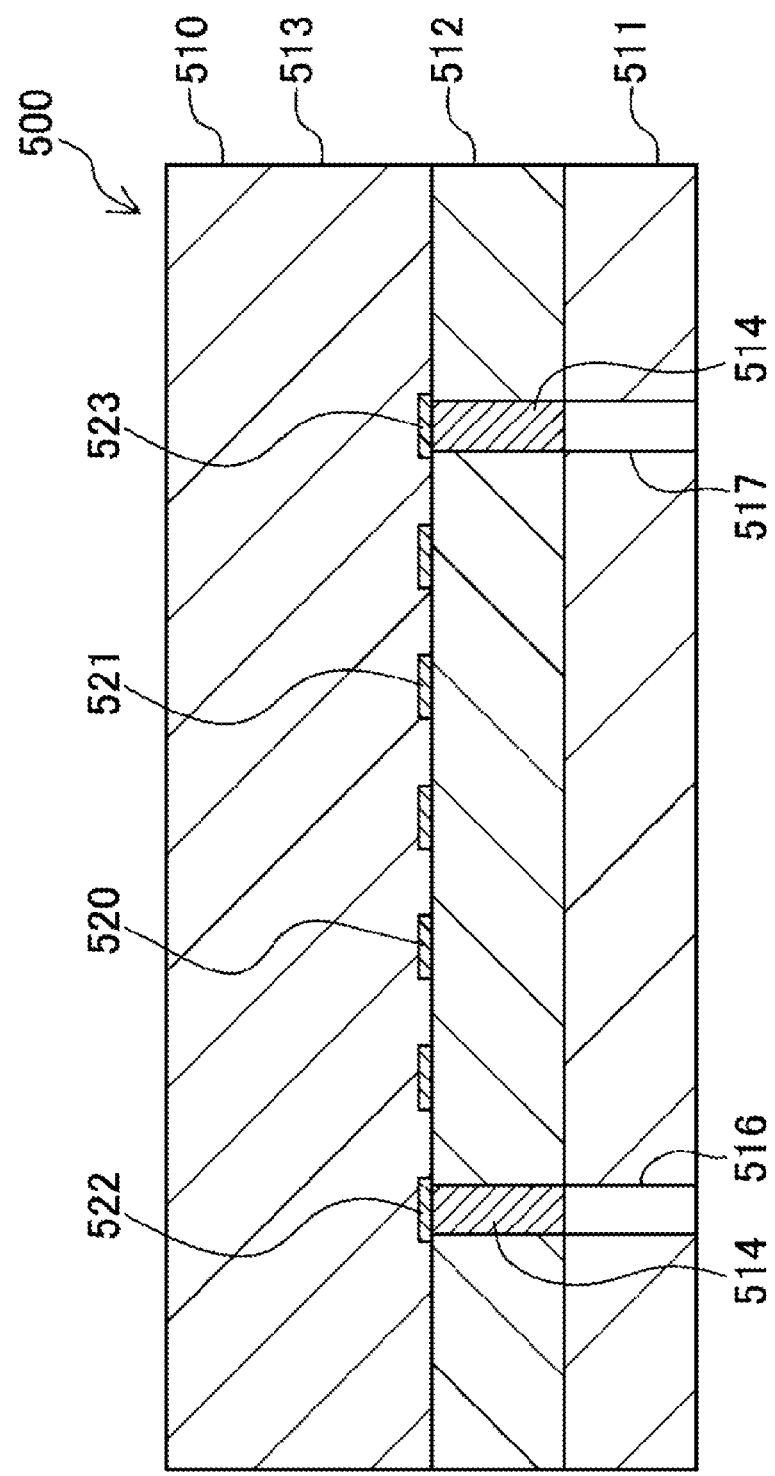
FIG. 10 is a schematic cross-sectional view of a ceramic heater according to another embodiment of the present invention.

(4) The ceramic device according to the present invention is not limited to the embodiments described above. As in the ceramic device 500 shown in FIG. 10, the conducting wires and connection conductor may be omitted. Even in a ceramic device 500 with such a simplified configuration, resistance heating element or electrode patters that are more complex and elaborate than in the conventional art can be achieved within the technical concept of the present invention.

(5) The geometry of the ceramic device according to the present invention is not limited to the embodiments described above. For example, instead of being disc-shaped, the ceramic device may be selected from any shape, including rectangular, oval, or other polygonal shapes. In addition, the relative thicknesses and diameters of the layers can be freely set depending on the application of the device. Further, the ceramic substrate is not limited to a three-layer structure, but additional layers may be added both above and below.

(6) In the ceramic device according to the embodiments described above, the difference in brightness of the layers is obtained through the number of sintering processes and time, but may also be effected by altering the material or components of the layers.

(7) In the ceramic device according to the embodiments described above, the ceramic device was produced by sandwiching the sintered body constituting the intermediate layer between ceramic raw material powder that would become the base layer and the overlayer and subjecting the layers to compression sintering, but the invention is not so limited. For instance, one or both of the base layer and overlayer may be prepared as a ceramic sintered body rather than ceramic raw material powder, placed on the ceramic sintered body and subjected to compression sintering at a temperature of about 1750° C. to 2000° C. and a pressure of 100 to 200 kgf/cm$^2$. At this time, the ceramic sintered bodies corresponding to the layers may be directly bonded to one another. Alternatively, a bonding material made from a powder of the same kind as the base ceramic may be coated or printed on a bonding surface of the ceramic sintered body, and the ceramic sintered bodies subjected to compression sintering with the bonding material sandwiched between each of the layers.

(8) The ceramic device according to the embodiments described above may be an electrode device for a static chuck mainly used for holding silicon wafers and the like by means of its static electricity. Specifically, instead of the heater wires 120 as in the embodiments described above, the ceramic device may include an electrode with a predetermined circuit pattern specially designed for static chuck applications. The electrode of the electrode device for a static chuck is configured to generate an area having a positive electrostatic charge on the ceramic surface. It goes without saying that the electrode device for a static chuck exhibits the same effects as the ceramic heater 100 according to the embodiments described above, i.e. the electrode is not inclined, the terminal positions can be freely designed, and the pattern can be made more elaborate. It is also possible to use both the resistance heating element and the electrode simultaneously.

(9) The ceramic device according to the embodiments described above may be an RF (radio frequency) electrode device mainly used in plasma processing of a subject. Specifically, instead of the heater wires 120 as in the embodiments described above, the ceramic device may include an electrode with a predetermined circuit pattern specially designed for RF electrode applications. According to this ceramic device, by arranging a pair of RF electrode devices to face each other on opposite sides of a subject, and applying a high-frequency voltage between the two RF electrodes, plasma can be generated between the electrodes, allowing for plasma processing of the subject. It goes without saying that the RF electrode exhibits the same effects as the ceramic heater 100 according to the embodiments described above, i.e. the electrode is not inclined, the terminal positions can be freely designed, and the pattern can be made more elaborate. It is also possible to use both the resistance heating element and the electrode simultaneously.

The present invention is not limited to the embodiments and variants described above, but can be practiced in various aspects without departing from the technical scope of the present invention.

DESCRIPTION OF THE REFERENCE NUMERALS

100 ceramic heater (ceramic device)
110 ceramic substrate
111 base layer
112 intermediate layer
113 overlayer
114 via
115 connection conductor
116 connection hole
117 connection hole
118 connection hole
120 heater wire (resistance heating element or electrode)
121 heater pattern (predetermined pattern)
122 start end
123 terminal end
130 conducting wire
131 connection part

What is claimed is:

1. A ceramic device comprising: a ceramic substrate consisting of a ceramic sintered body and including at least a base layer, an intermediate layer laminated on an upper surface of the base layer, and an overlayer laminated on an upper surface of the intermediate layer; and a resistance heating element or an electrode having a predetermined pattern that extends in a planar shape and being embedded in the ceramic substrate, conducting wires having a predetermined conducting wire pattern that extends in a planar shape between the intermediate layer and the base, the resistance heating element or the electrode is arranged along the upper surface of the intermediate layer, and the overlayer is laminated on the upper surface of the intermediate layer such that the overlayer covers the resistance heating element or the electrode, and wherein provided at the intermediate layer is at least one connection conductor extending from the conducting wires toward the upper surface of the intermediate layer at a length less than a thickness of the intermediate layer, and provided at the base layer is at least one connection hole that opens from a lower surface of the base layer toward the connection conductor.

2. The ceramic device according to claim 1, wherein provided at the intermediate layer is at least one via that is electrically connected to the resistance heating element or the electrode and which extends from the upper surface to a lower surface of the intermediate layer, and provided at the base layer is at least one connection hole opening from the lower surface of the base layer toward the via.

3. The ceramic device according to claim 1, wherein a horizontal surface is defined in a lower surface of the intermediate layer, and the conducting wires are arranged along the lower surface of the intermediate layer.

4. The ceramic device according to claim 1, wherein the connection conductor consists of a pin extending in a thickness direction and has a rounded upper end.

5. The ceramic device according to claim 1, wherein at respective boundaries of the base layer, the intermediate layer, and the overlayer, adjacent layers are adhered to each other without gaps.

6. The ceramic device according to claim 1, wherein the resistance heating element or the electrode consists of a patterned conductive foil.

7. The ceramic device according to claim 1, wherein the conducting wires consist of a patterned conductive foil.

8. A ceramic device comprising:
a ceramic substrate consisting of a ceramic sintered body and including at least a base layer, an intermediate layer laminated on an upper surface of the base layer, and an overlayer laminated on an upper surface of the intermediate layer;
a resistance heating element or an electrode having a predetermined pattern that extends between the intermediate layer and the overlayer and being embedded in the ceramic substrate, the resistance heating element or the electrode being electrifiable; and
conducting wires having a predetermined conducting wire pattern that extends between the intermediate layer and the base layer and being embedded in the ceramic substrate in a different layer than the resistance heating element or the electrode,
wherein further provided at the intermediate layer is at least one connection conductor extending from the conducting wires toward the upper surface of the intermediate layer at a length less than a thickness of the intermediate layer, and
provided at the base layer is at least one connection hole that opens from the lower surface of the base layer toward the connection conductor, and
wherein the intermediate layer differs in brightness from the base layer and the overlayer.

9. The ceramic device according to claim 8, wherein provided at the intermediate layer is at least one via that is electrically connected to the resistance heating element or the electrode and the conducting wires and which extends from the upper surface to a lower surface of the intermediate layer, the conducting wires connecting the via and the connection conductor.

10. The ceramic device according to claim 1, wherein the electrode is an electrode for a static chuck or an RF electrode.

11. A ceramic device comprising:
a ceramic substrate consisting of a ceramic sintered body and including at least a base layer, an intermediate layer laminated on an upper surface of the base layer, and an overlayer laminated on an upper surface of the intermediate layer;
a resistance heating element or an electrode having a predetermined pattern that extends in a planar shape and being embedded in the ceramic substrate, the resistance heating element or the electrode being electrifiable; and
conducting wires having a predetermined conducting wire pattern that extends in a planar shape between the intermediate layer and the base layer,
wherein the resistance heating element or the electrode is arranged along the upper surface of the intermediate layer, and the overlayer is laminated on the upper surface of the intermediate layer such that the overlayer covers the resistance heating element or the electrode,
wherein provided at the intermediate layer is at least one connection conductor extending from the conducting wires toward the upper surface of the intermediate layer at a length less than a thickness of the intermediate layer,
wherein provided at the base layer is at least one connection hole that opens from the lower surface of the base layer toward the connection conductor, and
wherein the connection conductor consists of a pin extending in a thickness direction and has a rounded upper end.

* * * * *